US008255700B2

(12) United States Patent
Kitariev et al.

(10) Patent No.: US 8,255,700 B2
(45) Date of Patent: Aug. 28, 2012

(54) LOCKSTEP MECHANISM TO ENSURE SECURITY IN HARDWARE AT POWER-UP

(75) Inventors: Dimitri Kitariev, Laguna Niguel, CA (US); Geoffrey Shippee, La Jolla, CA (US); Srinivas Varadarajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1096 days.

(21) Appl. No.: 10/881,534

(22) Filed: Jun. 29, 2004

(65) Prior Publication Data

US 2005/0289355 A1 Dec. 29, 2005

(51) Int. Cl.
G06F 21/00 (2006.01)
(52) U.S. Cl. ............... 713/189; 380/2; 726/27
(58) Field of Classification Search .......... 380/1, 2; 713/182, 189; 726/27
See application file for complete search history.

(56) References Cited

U.S. PATENT DOCUMENTS

| | | | | |
|---|---|---|---|---|
| 5,357,572 A | | 10/1994 | Bianco et al. | 380/23 |
| 5,673,317 A | * | 9/1997 | Cooper | 380/249 |
| 5,919,257 A | * | 7/1999 | Trostle | 726/22 |
| 6,396,391 B1 | * | 5/2002 | Binder | 340/538.15 |
| 6,499,124 B1 | | 12/2002 | Jacobson | 714/727 |
| 6,711,082 B1 | * | 3/2004 | Loffler | 365/222 |
| 2002/0054521 A1 | * | 5/2002 | Sato | 365/200 |
| 2003/0088779 A1 | * | 5/2003 | Kelley et al. | 713/184 |
| 2003/0177373 A1 | * | 9/2003 | Moyer et al. | 713/189 |

FOREIGN PATENT DOCUMENTS

| | | |
|---|---|---|
| EP | 1439398 | 7/2004 |
| WO | 03081400 | 10/2003 |

OTHER PUBLICATIONS

International Search Report and Written Opinion—PCT/US2005/022937, International Search Authority—European Patent Office—Jan. 16, 2006.
IEEE Standard Test Access Port and Boundary-Scan Architecture, IEEE Std 1149.1, 2001 (Reaffirmed 2008), pp. 1-200.

* cited by examiner

*Primary Examiner* — Gilberto Barron, Jr.
*Assistant Examiner* — Devin Almeida
(74) *Attorney, Agent, or Firm* — Kevin T. Cheatham; Won Tae Kim

(57) ABSTRACT

A system and method of ensuring hardware security of a device, such as an integrated circuit having secure data stored thereon. The integrated circuit or other hardware device can implement one or more configurable fuses that limit access to one or more secure locations within the device. The secure locations may contain secure data. The state of the configurable fuses can be ensured, thereby limiting access to secure locations, by forcing the occurrence of a logical state prior to allowing access to hardware locations configured by the fuses. A configurable non-secure access code can be used to force the occurrence of the logical state. Receipt of the non-secure access code by the hardware device forces the occurrence of the hardware state, thereby ensuring access only to those secure locations configured by the fuses.

24 Claims, 4 Drawing Sheets

LOCKSTEP MECHANISM TO ENSURE SECURITY IN HARDWARE AT POWER-UP

BACKGROUND OF THE DISCLOSURE

Various device and circuit board designs are used in the struggle to continually miniaturize consumer electronics. Integrated circuits (IC's) used in circuit boards have migrated from through-hole packages to leaded surface mount packages, and then to leadless surface mount packages. Leadless surface mount packages, such as Ball Grid Array (BGA) packages, do not allow a bed of nails tester to directly access the package connections. In some cases, circuit board designers implement conductive pads or lands that allow a connection to a bed of nails tester. However, these test pads or lands consume valuable circuit board real estate and impede a designer's ability to effectively miniaturize a circuit board. In high speed electronic circuits, the test pads or lands may adversely affect the performance of the circuit. Moreover, as IC's incorporate increased functionality, the ability to physically probe logical blocks becomes infeasible.

A variety of circuit board test techniques have been developed to allow for testing of assembled printed circuit boards and complex IC's without the need for physical test pads at each connection. One such technique developed by the Joint Test Action Group (JTAG) has evolved into an Institute of Electrical and Electronics Engineers (IEEE) standard. IEEE standard 1149 entitled TEST ACCESS PORT AND BOUNDARY-SCAN ARCHITECTURE specifies the hardware and software used to perform boundary-scan testing. Devices, such as printed wiring assemblies, programmable logic devices, and Application Specific Integrated Circuits (ASIC) can incorporate an IEEE 1149 compliant port, commonly referred to as a JTAG port or JTAG interface, to allow boundary scan verification and test of logic, registers, and connections within the device.

Because the JTAG interface can be configured to provide access to all logical structures and registers within a device, secure devices can be compromised via an attack executed using the JTAG interface. For example, a system may use a secure hardware key stored in an ASIC to allow encrypted data to be decrypted at the device. Additionally, the ASIC may use the hardware key to encrypt or encode data that is to be stored in external memory, such as in non-volatile memory that is external to the ASIC.

One common application of a secure environment is electronic commerce conducted using digital rights management performed in a cellular phone. Cellular phones typically allow a user to download various ring tones, songs, games, applications, and screen displays, and may even allow a user to remotely enable features on the phone. The various ring tones, screen displays, and other phone features and applications may be offered on a per unit cost basis. Thus, a user may request and download one or more ring tones at a given cost. Data files, such as those that represent a ring tone, are typically stored in non-volatile memory that is external to an ASIC that performs the data recovery. Additionally, because a service provider can charge for downloaded files, the downloaded files are typically encrypted before being transmitted and are also typically encrypted when stored in the non-volatile memory to reduce the possibility of a user redistributing the downloaded file. A hardware key stored in the ASIC may be used to perform data decryption. The hardware key may be unique to a particular phone to further limit use of the encrypted data.

Thus, in order to secure the encrypted data, the hardware key must be maintained in a secure environment. Access to the hardware key via external interfaces must be limited to ensure the security of the hardware key. Unfortunately, boundary scan testing, such as JTAG testing, allows access to internal logic within a device, such as an ASIC. Eliminating boundary scan access to the logic containing the hardware key can greatly limit the scope of testing and verification that may be performed on the ASIC. However, providing unlimited access to the internal logic of the ASIC can severely compromise the integrity of the secure hardware key.

BRIEF SUMMARY OF THE DISCLOSURE

A secure electronic device and method of securing access to a communication port of an electronic device, such as a JTAG test interface in an ASIC are disclosed. The device may be secured from physical attacks by initializing the port in a disabled or otherwise severely limited state. The configured accessibility of the port may be enabled when the device receives a non-secure access key vector. The ASIC compares the received non-secure access key vector against an internally stored access key and enables the communication port in the ASIC if a predetermined relationship exists between the two. As part of enabling the communication port, the ASIC may perform an initialization routine and may selectively enable access via the communication port in response to a predetermined access configuration. The access configuration may be determined based in part on states of one or more fuses within the ASIC.

In one aspect, the disclosure includes a method of securing an electronic device including initializing the electronic device in a disabled state, receiving an access key vector, comparing the access key vector to a stored access key, and setting the electronic device to an enabled state based in part on a result of comparing the access key vector to the stored access key.

In another aspect, the disclosure includes a method of securing an electronic device, including initializing the electronic device in a boundary scan test disabled state, receiving a non-secure access key vector via a boundary scan test interface, comparing the non-secure access key vector to a stored access key, performing an initialization process if the non-secure access key vector and the stored access key have a predetermined relationship, sensing at least one fuse state following the initialization process, and setting the electronic device to a boundary scan enabled state based in part on the at least one fuse state.

In still another aspect, the disclosure includes a secure electronic device including a boundary scan interface configured to selectively provide a boundary scan access to the device based in part on a test access state, an unlock chain module configured to receive an access key vector via the boundary scan interface, an access key module configured to store an access key value, and a comparator configured to compare the and initialize the test access state based in part on a relationship of the access key vector to the access key value.

In yet another aspect, the disclosure includes a secure test system including a tester configured to store at least one test vector pre-pended by an access key vector, and an electronic device having a test interface coupled to the tester. The electronic device includes a test access module configured to selectively provide a test access to the device based in part on a test access state, an unlock chain module configured to receive an access key vector via the boundary scan interface, an access key module configured to store an access key value, and a comparator configured to compare the and initialize the test access state based in part on a relationship of the access key vector to the access key value.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

DETAILED DESCRIPTION OF THE DISCLOSURE

A secure device, such as an ASIC having a secure hardware key stored in a register, can limit access to secure portions of the device using one or more fuses that can be selectively blown. The state of the fuses may be read and corresponding chip access may be enabled or disabled based on the state of the fuses. Upon initial energization or power-up of the ASIC, the state of one or more of the fuses may be floating, random, or otherwise indeterminate. Alternatively, the state of the logic that senses the fuse states may be initialized in a random or otherwise non-functioning state and may not be able to read the fuse states until after the chip performs an initialization process that is normally part of the power-on reset routine. The fuses, or alternatively the circuits that read the fuse states, may be initialized as part of a power-on reset process to ensure their proper states. The result of either the fuse states initializing in a random state, or the sensing logic initializing in a state that cannot read the fuse states is the same. Effectively, the fuse states are random or indeterminate.

The random or indeterminate state of the fuses upon initial power-up, prior to a power-on reset, can provide an opportunity for an attack on the security features of the ASIC. In normal operation, the device under test 10 is typically configured with an external reset connection that triggers a power-on reset after energization of the device under test 10. However, an attacker can physically disable the power-up reset and continually cycle the chip power in the hopes that the random nature of the fuses allows external access to the secure locations. In one embodiment, the device under test includes a physical reset connection and an attacker can physically disconnect the reset connection from its associated circuits. For example, an attacker can drill a hole through a printed circuit board to physically disconnect a reset connection on a BGA device, such as an ASIC.

The ASIC can be secured against the power-up attack using a non-secure access key. The ASIC can be configured to provide access only after receipt of the non-secure access key. However, the ASIC can be configured such that receipt of the non-secure access key initializes performance of an internal reset that is similar in nature to the power-on reset. The internal reset ensures that the fuses that provide access to the various chip features, registers, and locations are in the proper state, thereby ensuring that the access level enabled by the programmable fuses is maintained.

The following detailed description describes a secure ASIC that maintains security against a power-on attack conducted on a fused JTAG interface. However, the detailed description is provided only as an example, and the techniques, security system, security apparatuses, and security methods may be implemented in other secure environments without deviating from the scope of the disclosure as set forth in the claims.

Figure 1:
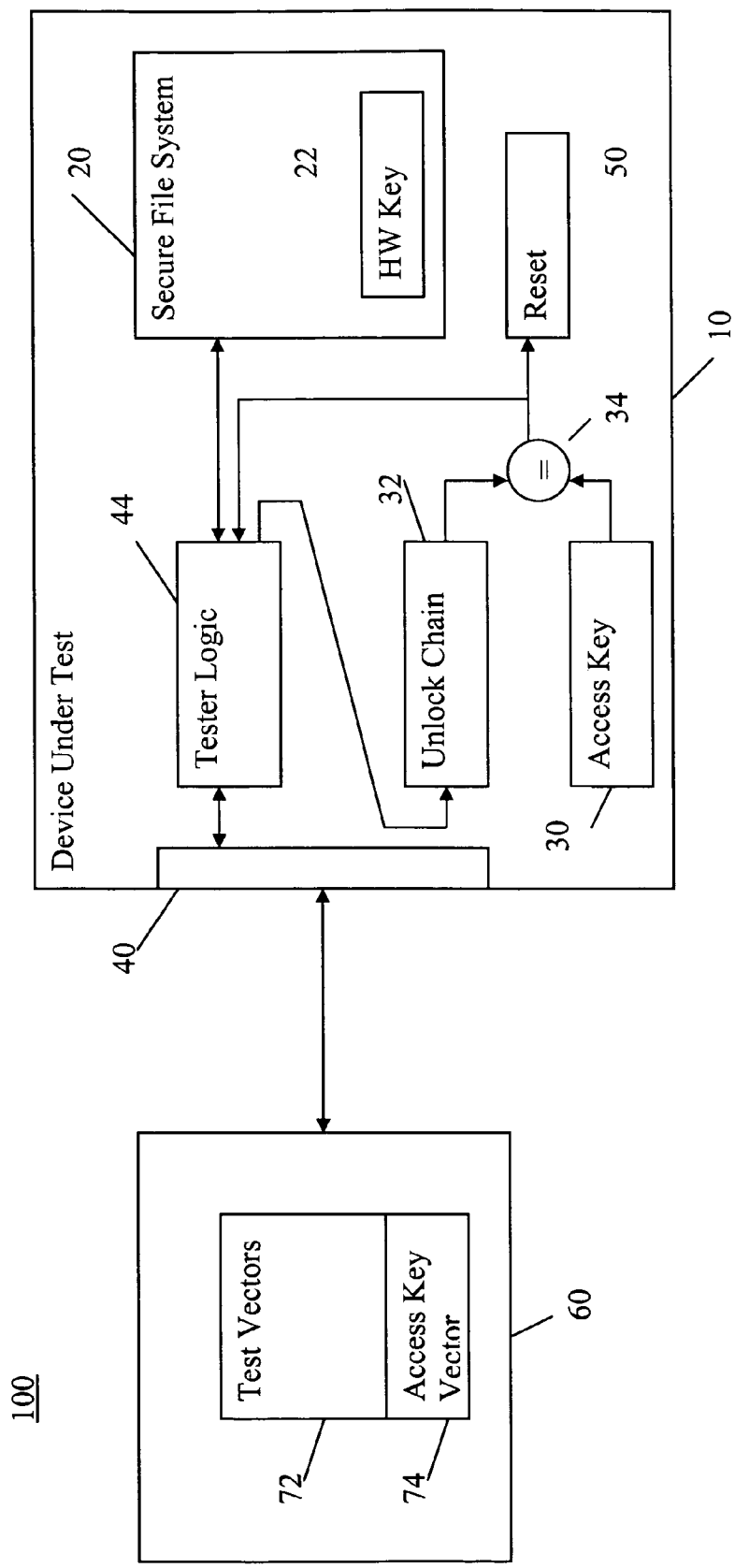
FIG. 1 is a functional block diagram of a secure data system having a secure hardware key.

FIG. 1 is a functional block diagram of a secure data system 100 having a secure hardware key 22. The secure data system 100 includes a device under test 10 having a secure hardware key 22 stored therein as part of a secure file system 20. The device under test 10 is coupled to a tester 60.

The device under test 10 includes a secure file system 20 where files, applications, and other data may be securely stored. The secure file system 20 may also include one or more memory locations where non-secure data is stored. The secure file system 20 can include one or more register locations that are used to store a secure hardware key 22. The secure hardware key 22 can be, but is not required to be, a key that is unique to the device under test 10. The secure hardware key 22 refers to one or more signals, bits, states, levels, transitions, numbers, codes, or the like.

In one embodiment, the secure hardware key 22 is hardwired within the secure file system 20. In another embodiment, the secure hardware key 22 is stored in one or more registers in non-volatile memory within the secure file system 20. In still another embodiment, the secure hardware key 22 is stored as a combination of hardwired locations and non-volatile memory registers.

The device under test 10 can also include a test interface 40 that is used to couple the device under test 10 to a tester 60. The test interface 40 can be, for example, a JTAG interface. The test interface 40 can be coupled to tester logic module 44. In some embodiments, the test interface 40 includes the tester logic module 44. The tester logic module 44 can include one or more fused links and control logic. The one or more fused links can include metal fuses, poly fuses, electronic fuses, electrically programmable fuses (e-fuses), fusible links, and the like, or some other means for fusing a link. The value of the fuse states can be used to selectively enable or disable tester access to various device under test 10 circuits, connection, and registers.

For example, the device under test 10 can be an ASIC that is configured with a plurality of modules. The modules can include, for example, an application processor, modem processor, and digital rights management (DRM) circuits in a secure file system. The fuses can be selectively blown in order to limit tester 60 access. In a first fuse state configuration, tester 60 access to the DRM circuits and secure file system may be disabled, but tester 60 access to the other remaining modules in the device under test 10 may remain enabled. In another fuse state configuration, all tester 60 access may be disabled. In still another fuse state configuration, the tester 60 may have access to the application processor but no other modules. Other configurations can be configured, and the number of configurations are only limited by the number of fuse connections, the number of modules, and the complexity of associated control logic.

The control logic within the tester logic module 44 can include one or more circuits configured to enable access by the tester based at least in part on the values of the one or more fused links. For example, in addition to the access possibilities discussed above, the device under test 10 can be configured to enable the tester 60 to access all of the logic, registers, and connections within the device under test 10 under a specific combination of open and closed fused links. For example, the device under test 10 can enable full access to the tester 60 only if none of the fused links have been burned or otherwise opened. A fuse in the burned state may correspond to a logic high or logic low, depending on the fuse configuration. Additionally, the control logic, as well as all logic described in the detailed description, may be implemented as active low or active high logic, as is understood by those of ordinary skill in logic design.

The tester logic module 44 can be coupled to an unlock chain module 32. In one embodiment, all tester 60 access to the device under test 10 is disabled upon power up, except that the tester 60 may be configured such that access by a tester 60 to the unlock chain module 32 is always enabled and available regardless of the fuse states and the test disabled state. Thus, disabled access can refer to access to modules other than the unlock chain module 32. The unlock chain module 32 can be configured to receive an access key vector 74 from the tester 60. The unlock chain module 32 can include, for example, one or more parallel registers, one or more serial registers, or a combination of serial and parallel registers.

The output of the unlock chain module 32 can be coupled to a first input of a first comparator 34 or some type of logic comparison module. An access key circuit 30, also referred to simply as an access key, can be coupled to a second input of the first comparator 34. The access key circuit 30 can include data stored in one or more registers, or one or more hardwired connections that represent an access code. Typically, the access key circuit 30 stores a binary value referred to as an access key or access code that is of a sufficient number of bits to reduce the probability of random or unintentional match. In one embodiment, the access key is 64-bits in length. In other embodiments, the access key can be 16, 32, 128, 256 bits in length, or some other length and is not limited to a number of bits that is a factor of two. The value of the access key can be secure or can be non-secure.

The first comparator 34 can compare the value of the access code stored in the access key circuit 30 against data received by the unlock chain module 32. The first comparator 34 can provide an output signal based in part on the value of the access code and the value of the data stored in the unlock chain module 32. In the embodiment shown in FIG. 1, the first comparator 34 provides a first output if the access code matches the data received by the unlock chain module 32. For example, the first comparator 34 can output a logical one if the access code is equal to the data received by the unlock chain module 32 and can output a logical zero if the two do not match exactly.

Of course the first comparator 34 need not compare the two input values directly, and need not provide an output solely in response to a match. In other embodiments, the first comparator 34 may output a logical one if there is some predetermined relationship between the access code and the data received by the unlock chain module 32. For example, the first comparator 34 may output a logical one if the value stored in the unlock chain module 32 differs from the access key circuit 30 value by some predetermined amount. In other embodiments, the first comparator 34 can be configured to perform a transformation on the data received by the unlock chain module 32 and compare the transformed value against the access key circuit 30 value or some transformed access key circuit 30 value.

The output of the first comparator 34 can be coupled to a reset module 50. The reset module 50 can be, but is not limited to, a power-on reset module. The reset module 50 can perform all of the functions normally performed during a power-on reset of the device under test 10. Alternatively, the reset module 50 can be configured to perform a subset of the functions performed during power-on reset, or the reset module 50 can be configured to perform all of the power-on reset functions plus additional functions.

In one embodiment, the reset module 50 configures the state of the tester logic module 44, including initiating all of the e-fuses and e-fuse sensing modules, sensing the values of the e-fuses, and configuring, or otherwise enabling tester 60 access based at least in part on the e-fuse states. For example, in one embodiment, initialization of the e-fuses and the tester logic module 44 may enable tester 60 access to the secure file system 20.

Thus, upon power-up and prior to receipt of proper access data, the device under test 10 disables all tester 60 access, except for access to the unlock chain module 32. Following receipt of proper access data, the device under test 10 performs a reset function that ensures that the tester logic module 44 is properly initialized. The device under test 10 can then enable access to the tester 60 based on the values of the e-fuses.

In the embodiment shown in FIG. 1, the unlock chain module 32, access key circuit 30, and first comparator 34 have no effect on the normal operation of the device under test. Therefore, when the device under test 10 is operated for its intended application and is initialized with a typical power-on reset, the functionality of the device under test 10 is not affected. A tester 60 needs to present the proper access data prior to being granted tester access.

The device under test 10 can include, for example, a printed wiring assembly, an ASIC, a programmable logic device (PLD) a field programmable gate array (FPGA), a modem, a personal digital assistant (PDA), a computer, a notebook computer, a pager, a radio, a phone, a mobile phone, such as a cellular type phone, and the like, or some combination thereof, or some other means for receiving secure data. The various types of device under test 10 may be referred to using alternative nomenclature. For example, the mobile phone may alternatively be referred to as a phone, a mobile unit, a handheld phone, a portable phone, a user device, a mobile terminal, or a user terminal.

The tester 60 can be a JTAG tester having a number of test data used to interrogate and verify the contents of the device under test 10. The test data can include one or more test vectors 72 prepended by an access key vector 74. The access key vector 74 can be secure or non-secure. There may not be a need to secure the access key vector 74 because the access key vector 74 is typically used solely to enable access to the portions of the device under test 10 that are configured by the e-fuses. Thus, compromise of the access key vector 74 does not result in access to portions of the device under test 10 not enabled by the e-fuse configuration.

The tester 60 is not limited to a JTAG tester but can be, for example, a JTAG tester, an Automated Test Pattern Generator (ATPG), a Built In Test System (BITS), a Built In Self Test (BIST) engine, and the like, or some other means for testing a device. The tester 60 may be configured external to the device under test 10 or may have one or more components implemented within the device under test 10. Additionally, while the detailed description is directed to a device under test 10 coupled to a tester 60, the disclosure can be directed to any communication link between a device under test 10 and an external communication device. Furthermore, the communication link need not occur within a test environment.

Figure 2:
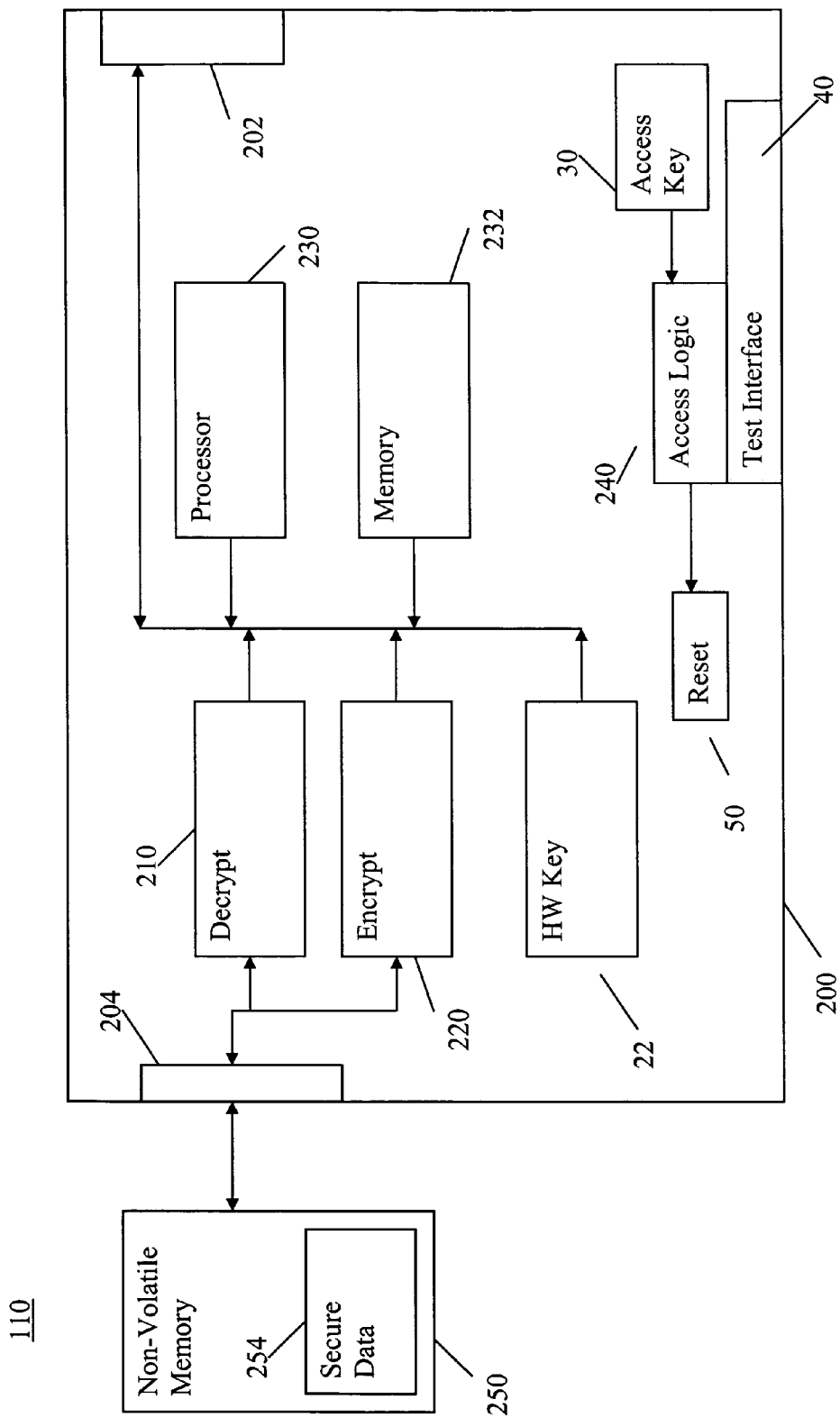
FIG. 2 is a functional block diagram of a device implementing a secure hardware key and limited tester access.

FIG. 2 is a functional block diagram of an electronic device 110 implementing a secure hardware key and limited tester access.

The electronic device 110 can include a signal processing module 200 coupled to non-volatile memory 250. The signal processing module 200 can include an input 202, which can be an input bus interface. The signal processing module 200 can exchange data with external devices via the input 202. Additionally, the signal processing module 200 can include an output 204, which can be an output bus interface. The output 204 couples the signal processing module 200 to the non-volatile memory 250. In some embodiments, the input bus interface and output bus interface can be the same interface.

The non-volatile memory 250 can be internal or external to the signal processing module 200. The non-volatile memory 250 can include one or more secure data registers 254 used to store secure data. The secure data can be, for example, data that is communicated to the electronic device 110 using a DRM application.

During operation, the electronic device 110 can receive encrypted data and decrypt it in the signal processing module 200. The signal processing module 200 or some other module coupled to the signal processing module 200 (not shown) can use the decrypted data. However, to maintain the secure nature of the data, the signal processing module 200 re-encrypts the decrypted data prior to storing it in non-volatile memory 250.

In one embodiment, the electronic device 110 can be a mobile phone. The signal processing module 200 can include baseband processing modules or a baseband processing ASIC, and the non-volatile memory 250 can include flash memory.

As an example, a user of a mobile phone can request to download a data file representing a copyrighted song or ring tone. The user may be billed for downloading the data file and the vendor as well as the copyright holder may have an interest in preventing the user from redistributing the downloaded file. A DRM application may be used to maintain the secure nature of the data file. The data file is encrypted at the source prior to transmitting the data to the phone. The phone receives the encrypted data file and can decrypt the data using a secure hardware key 22 stored in the phone. The phone can then freely use the decrypted data file within phone applications. However, in order to maintain the security of the downloaded file, the baseband processing modules in the phone re-encrypt the decrypted data prior to storing the data file in flash non-volatile memory 250. If the data file were not re-encrypted prior to storage in the non-volatile memory 250, the decrypted file could be recovered by merely reading the contents of the non-volatile memory 250. Other types of secure data may also be stored in non-volatile memory 250. For example, a user's billing plan, mobile identification number, electronic serial number, and other data may be encrypted prior to storage in non-volatile memory 250.

Therefore, to maintain the digital rights and secure data, the signal processing module 200 can include at least one secure hardware key 22, decryption module 210, and encryption module 220. The secure hardware key 22 used to decrypt received secure data is typically the same used to encrypt and decrypt data stored in the non-volatile memory 250, although such identity of keys is not a requirement.

The signal processing module 200 can also include a processor 230 and memory 232. The memory 232 can include volatile as well as non-volatile memory. The memory 232 can include processor readable instructions that, when read and executed by the processor 230, direct the processor 230 to perform a series of steps, functions, or processes. Thus, although various modules having various distinct functions are described in FIG. 2 as well as the other figures, the modules may be performed, either wholly or in part, by a processor executing processor readable instructions stored in memory. For example, the decryption module 210 or the encryption module 220 may be performed by the processor 230 operating on software stored in memory 232. Additionally, the processor 230 in conjunction with software stored in memory 232 can perform some or all of the functions performed by access logic 240.

The signal processing module 200 can also include the tester access described in FIG. 1. The signal processing module 200 can include a test interface 40 that provides an external interface to a tester, such as the tester 60 of FIG. 1. The test interface 40 can be coupled to access logic 240 that can include the tester logic module 44, unlock chain module 32 and first comparator 34 described in FIG. 1.

The signal processing module 200 can also include an access key circuit 30 that can be hardwired. The access key circuit 30 can be coupled to the access logic 240 to form part of the test interface enablement. The signal processing module 200 can also include a reset module 50 that can perform some or all of the reset functions described in FIG. 1.

In one embodiment, the signal processing module 200 is an ASIC, such as a baseband processing ASIC, for a mobile phone. The ASIC may have the secure hardware key 22 and access key hardwired within the ASIC and may also have include an internal decryption module 210, encryption module 220, processor 230 and memory 232. Additionally, the ASIC may have a test interface 40, which may be, for example, a JTAG interface. The JTAG interface can be used during development of the ASIC to allow the various modules, connections, and registers to be tested. However, the level of functionality required of the JTAG test interface during development is far greater than that which is normally needed when the ASIC is released for use in production products. Functionality of the JTAG interface in production versions of the ASIC can have limited test capability by burning a fuse configuration within the ASIC, thereby disabling access to certain modules within the ASIC.

Thus, a production version of an ASIC may have a specific fuse configuration that disables access to the secure hardware key 22, decryption module 210 and encryption module 220. To protect the ASIC against potential power-on attacks conducted through the test interface 40, functionality of the test interface 40 is disabled upon power up of the ASIC. The test interface 40, and associated access logic 240 can be configured to require an access key vector in order to enable testing via the test interface 40. Upon receipt of the access key vector, the access logic 240 compares the access key vector against the stored access key circuit 30 and enables tester access if a predetermined relationship exists between the two. The access logic 240 can also initiate a reset module 50 in response to receipt of the proper access key vector. The reset module 50 can ensure that the ASIC is set to a known state, and can ensure the proper fuse states are sensed. Once the proper fuse states are sensed, the test interface 40 and access logic 240 will only enable the JTAG capabilities for the modules provided for by the fuse states.

Figure 3:
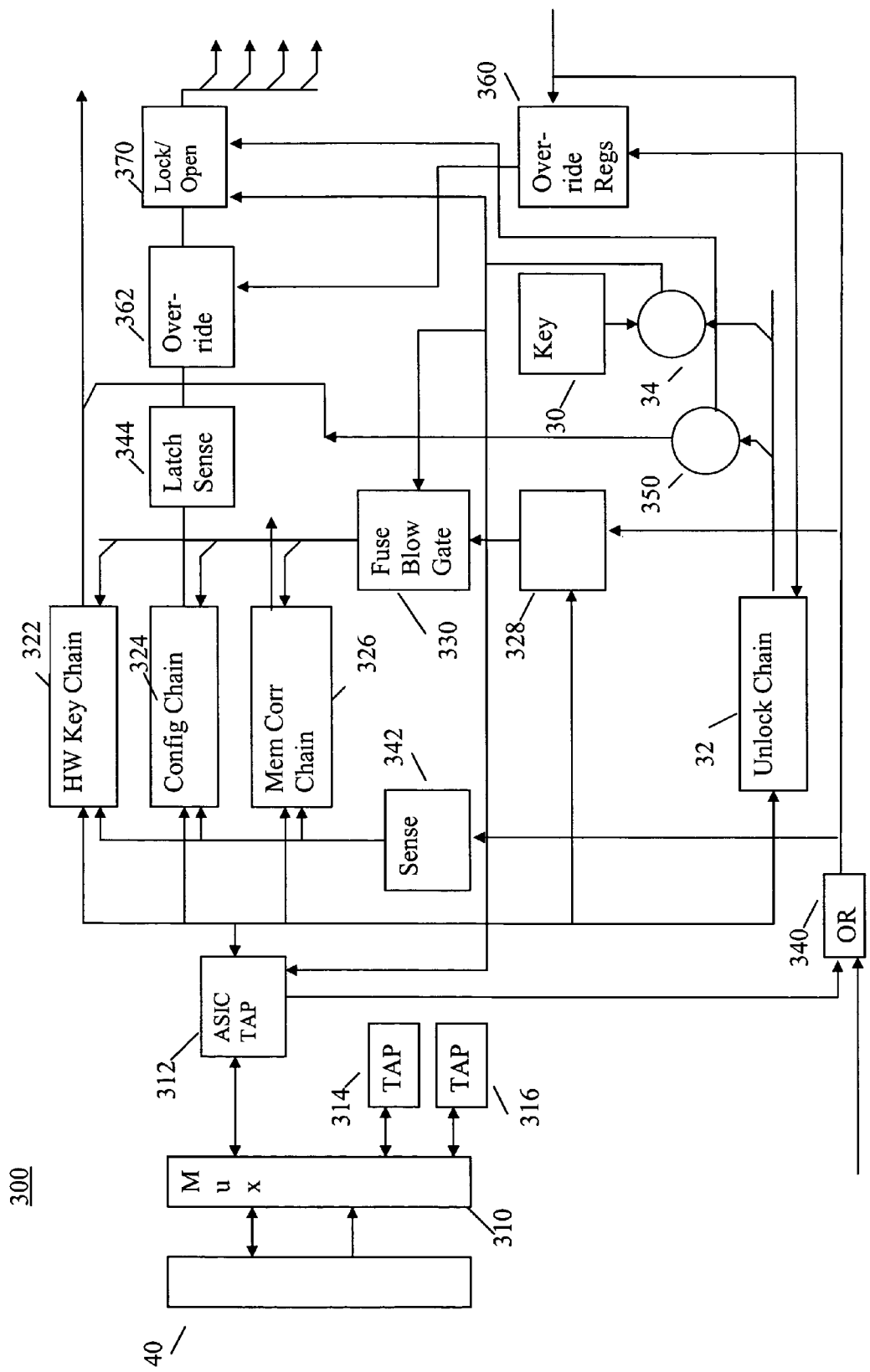
FIG. 3 is a functional block diagram of a secure debug hardware key implementation.

FIG. 3 is a functional block diagram of a secure debug hardware key implementation within an ASIC 300 for use in a mobile phone application. The ASIC 300 can be an embodiment of the signal processing module 200 of FIG. 2. Only the relevant portion of the ASIC 300 test interface is shown for purposes of clarity. It is understood that the ASIC 300 can include additional modules and functional blocks. Additionally, the various modules can be implemented as hardware, software executed by a processor, or a combination of hardware and software.

The ASIC 300 is configured to include a JTAG interface 40 having tester access that can be configured by fuse settings.

Additionally, the ASIC 300 includes a override configuration that allows the test access configuration enabled by the fuse states to be overridden using software.

The ASIC 300 includes a JTAG test interface 40 coupled to a multiplexer 310 that is coupled to plurality of JTAG Test Access Port (TAP) modules. The multiplexer 310 can be configured to allow communication with one of the plurality of TAP modules. In the embodiment shown in FIG. 3, the ASIC 300 includes three TAP modules. However, other configurations can include greater or fewer TAP modules. When only one TAP module is used, the multiplexer 310 can be eliminated.

An ASIC TAP module 312 can be configured to provide JTAG test access to the various ASIC 300 memory locations, configuration, and secure file system. Another TAP module 314 can be configured to provide JTAG test access to a processor, such as a RISC or an ARM processor. Yet another TAP module 316 can be configured to provide JTAG test access to a different ARM processor. The outputs of the ARM TAP modules 314 and 316 are not shown for the sake of clarity.

A scan port of the ASIC TAP module 312 can be coupled to a number of modules, and is used to transmit the various test vectors to the desired modules and to read the results of the scan process. The scan port of the ASIC TAP module 312 is coupled to a corresponding boundary scan input of a hardware key chain module 322, a configuration chain module 324, a memory correction chain module 326, a fuse blow control chain module 328, and an unlock chain module 32.

Each of the chain modules includes one or more serially linked connections that allow a JTAG boundary scan tester to verify connections and operations of the functions performed by the modules. In effect, a test latch, or boundary scan cell, is coupled to every testable connection within the chain. The serially linked boundary scan cells within each of the modules, 322, 324, 326, 328, and 32 are coupled to a respective boundary scan input on the module.

The hardware key chain module 322 includes the secure hardware key, sub-modules, functional blocks, and logic associated with the secure hardware key. In the embodiment shown in FIG. 3, the hardware key chain module 322 includes a serial chain that is 256 bits in length. The logic, registers, and functions relating to the hardware key chain module 322 may be accessed via a communication port. The hardware key chain module 322 includes at least one fuse, such as an electrically programmable fuse, that can be selectively blown to enable or disable tester access to the module. For example, a fuse may be placed within the serial chain, or one or more fuses may be combined with logic to selectively enable or disable tester access.

The hardware key chain module 322 includes a fuse-blow input to receive a fuse blow signal that indicates the fuse configuration that is to be implemented in the module. For example, the fuse blow signal can be a current that blows a single fuse, or the fuse blow signal can be an instruction that directs the hardware key chain module 322 to blow a particular fuse configuration. Additionally, the hardware key chain module 322 includes a sense input. The sense input receives a sense waveform signal that is used to sense the fuse configuration in the module. The sense input may be omitted if the type of fuses used in the hardware key chain module 322 do not need to be sensed.

The configuration chain module 324 includes the sub-modules, logic, registers, and functions associated with configuration of the ASIC 300. An output port of the configuration chain module 324 is coupled to a latch sensed register module 344.

The basic structure of the configuration chain module 324 is similar to that of the hardware key chain module 322. A number of boundary scan cells within the configuration chain module 324 are serially coupled to form a configuration chain. In the embodiment shown in FIG. 3, the configuration chain module 324 includes a chain of thirty-two boundary scan cells. The configuration chain module 324 can be configured as the communication path to additional modules, registers, and connections within the ASIC 300. The boundary scan data provided to the configuration chain module 324 can be directed via the output port to destinations.

The configuration chain module 324 includes a fuse-blow input to receive a fuse blow signal that indicates the fuse configuration that is to be implemented in the module. For example, the fuse blow signal can be a current that blows a single fuse, or the fuse blow signal can be an instruction that directs the configuration chain module 324 to blow a particular fuse configuration. Additionally, the configuration chain module 324 includes a sense input. The sense input receives a sense waveform signal that is used to sense the fuse configuration in the module.

Similarly the memory correction chain module 326 includes sub-modules, including logic, fuses, and registers used in memory correction. The memory correction chain module 326 can include an output port that is coupled to one or more onboard memory modules, such as ROM, RAM or a combination of ROM and RAM. The memory correction chain module 326 includes a number of boundary scan cells coupled in series and a fuse-blow input to receive a fuse blow signal that indicates the fuse configuration that is to be implemented in the module.

A fuse blow control chain module 328 is configured to control which fuses in the various modules are blown. The output of the fuse blow control chain module 328 is coupled to a fuse blow signal gating module 330 which gates the proper fuse blow signals to the various module fuse blow inputs.

The unlock chain module 32 is previously described in FIG. 1, and includes a number of serially coupled boundary scan registers. The number of registers in the unlock chain module 32 can correspond to the length of the access key vector used to enable tester access. In the embodiment shown in FIG. 3, the access key is sixty-four bits in length and the unlock chain module 32 contains 128 registers, which is far greater than the length of the access key. The additional registers are used as part of the software override feature as will be discussed below.

The 64 most significant bits (MSB) represented by the registers in the unlock chain module 32 are coupled to an input of a first comparator 34. The 64 least significant bits represented by the registers in the unlock chain module 32 are coupled to an input of a second comparator 350. The first comparator 34 inputs may be serial inputs or may be parallel inputs. Additionally, the first comparator 34 parallel input width may be less than, equal to, or greater than the number of bits in the access key circuit 30. If the first comparator 34 is entirely combinatorial logic, the number of input bits is at least equal to the number of bits in the access key circuit 30.

A 64-bit access key circuit 30 can be stored as a constant in one or more non-volatile ROM registers. The access key circuit 30 is provided to a second input of the first comparator 34. The first comparator 34 is configured to provide an unlock indication when the access key circuit 30 and the 64 MSB of the unlock chain module 32 are the same. The unlock indication may alternatively be referred to as an enable indication, or a test enable indication.

The output of the first comparator 34 is coupled to an input on each of the ASIC TAP module 312, and a lock/open logic module 370. In response to receipt of an unlock indication, the ASIC TAP module 312 outputs a reset indication. The reset indication may be a momentary reset indication and the length of the reset indication may be programmable as a function of a number of clock cycles. The clock may be a clock that is generated internal to the ASIC 300 or generated external to the ASIC 300. Additionally, the clock may be a system clock or may be a clock that is generated by an external tester.

The reset indication is coupled to reset logic 340 that performs a logical OR of the reset indication and a system reset indication. Thus, reset of the debug hardware occurs in response to either a system reset or a reset indication generated by the ASIC TAP module 312.

The output of the reset logic 340 is coupled to reset inputs on each of a sense module 342, the fuse blow control chain module 328, and an override register module 360. Each of the modules 342, 328, and 360 initializes to a known state in response to the reset signal or initiates a reset procedure to place associated modules in a known state in response to the reset signal. For example, the fuse blow control chain module 328 and the override register module 360 may initialize to a known state in response to receipt of a reset signal.

The sense module 342 can be configured to provide the sense waveforms and signals used in sensing the states of the fuses in the various modules. The output of the sense module 342 is coupled to the fuse sensing logic within each of the fusible modules. The sense module 342 provides the sense waveforms used in sensing the fuse states. Thus, rather than merely initializing its own state, the sense module 342 initiates the process of sensing the fuse states in response to a reset signal.

In response to the sense waveforms transmitted by the sense module 342, the fusible modules 322, 324, and 326 can each be configured to sense the fuse states and transmit the read fuse states to a latch sensed register module 344. The sensed fuse states can then be latched into the latch sensed register module 344 using a latch sensed pulse provided by the sense module 342. By latching the fuse states in the latch sensed register module 344, the fuse states need only be sensed one time following power-up, and the value stored in the latch sensed register module 344 remains valid provided the register contents are not corrupted or a fuse state changes.

In another embodiment, the sense module 342 can be configured to transmit the sense waveforms to the fusible modules and sense the fuse states. The sense module 342 can then be configured to transmit the value of the sensed fuse states to the latch sensed register module 344.

In addition to receiving and storing the sensed fuse states, the latch sensed register module 344 can be configured to couple test vectors received from the configuration chain module 324 to subsequent modules. The output of the latch sensed register module 344 can thus be configured to provide both the stored fuse states, as well as received test vectors to an output port that is coupled to the input of override logic 362.

Override logic 362 can be configured to compare enable test access configured by the override register module 360 regardless of the value of the fuse states. Thus, the override logic 362 can be configured to perform a logical OR of the test access enabled by the override register configuration and the test access enabled by the fuse states. The test vectors received from the latch sensed register module 344 are not affected by the override logic 362. The output of the override logic 362 is coupled to the input of a lock/open logic module 370.

The lock/open logic module 370 selectively communicates the received test vector based at least in part on the value of the fuse states, as modified by the override register module 360, and signals received at unlock and open inputs of the lock/open logic module 370. The lock/open logic module 370 can be configured to allow the test vectors to reach their destinations when the unlock signal is active. Additionally, the lock/open logic module 370 can be configured to allow the test vectors to be directed to the override register enabled modules only when the open signal is active. If the open signal is not active, the lock/open logic module 370 can be configured to only enable tester access to the modules enabled by the fuse states. Additionally, the open signal may be configured to override the state of the unlock signal, such that only the open signal needs to be active in order to unlock and open the communication path. As discussed above, the unlock signal is generated by the first comparator 34 when the 64 MSB of the unlock chain module match the 64 bit access key circuit 30. The open signal is similarly generated by the second comparator 350.

The second comparator 350 can be configured to compare the 64 LSB of the unlock chain module against the 64 MSB of the hardware key stored in the hardware key chain module 322. If the two values are equal, the second comparator 350 provides the open indication to the open input of the lock/open logic module 370.

The software override feature is advantageous for use when the test access enabled by the fuse configuration needs to be overridden. Typically, the fuses may only be blown once, and having been blown, are incapable of being remotely repaired. During the development cycle of an electronic device, such as the ASIC 300 of FIG. 3, initially, complete test access may be enabled. Test access to the ASIC 300 may be reduced as the development of the ASIC 300 proceeds. For example, after an initial debugging process performed by the ASIC 300 designers, a subsequent batch of ASICs 300 may have some fuse configuration that limits test access, but still provides an intermediate level of test access. This intermediate level of test access may be enabled in the batch of ASICs that are part of initial deliveries to OEM customers. Subsequent ASIC 300 lots that are destined for production use are produced with a very limited test access.

However, it is conceivable that during the course of production an OEM customer may encounter a bug that is believed to reside in the ASIC 300. In order to temporarily allow the OEM customer test access, the software override feature may be used.

The software override feature is enabled by programming the override register module 360 and applying an active open signal to the lock/open logic module 370. To limit the accessibility of the software override feature, the ability to program the software registers of the override register module 360 may be limited to special software that is shipped by the initial ASIC 300 manufacturer. The software can be, for example secure software that must be digitally signed and authenticated by the ASIC 300 manufacturer or designer.

The secure software can be loaded onto the ASIC 300 and executed to allow the fuse configuration to be overridden. The secure software can be configured to program the software registers, load the access key into the MSB of the unlock chain module 32, read the 64 MSB of the hardware key from the hardware key chain module 322, and load the 64 MSB of the hardware key as the 64 LSB of the unlock chain module 32. When these steps are all performed, the test configuration enabled by the fuse configuration may be overridden by the software registers of the override register module 360. The hardware key can be any length sufficient to provide security. The length of the hardware key is typically greater than or equal to 64 bits. It may be advantageous for the unlock chain module 32 to use less than the complete length of the hardware key in order to minimize the locations in which the complete hardware key may be accessed. Therefore, the unlock chain module 32 may be configured to load a subset of the hardware key and the subset can be, for example, one half of the bits of the hardware key and can be the upper MSB of the hardware key.

Thus, the ASIC 300 designer or manufacturer may maintain security of the hardware key, because the secure software may only read a portion of the hardware key and may load the bits of the hardware key into the unlock chain module 32. The software override register module 360 may be selectively programmed to provide less than complete test access.

Figure 4:
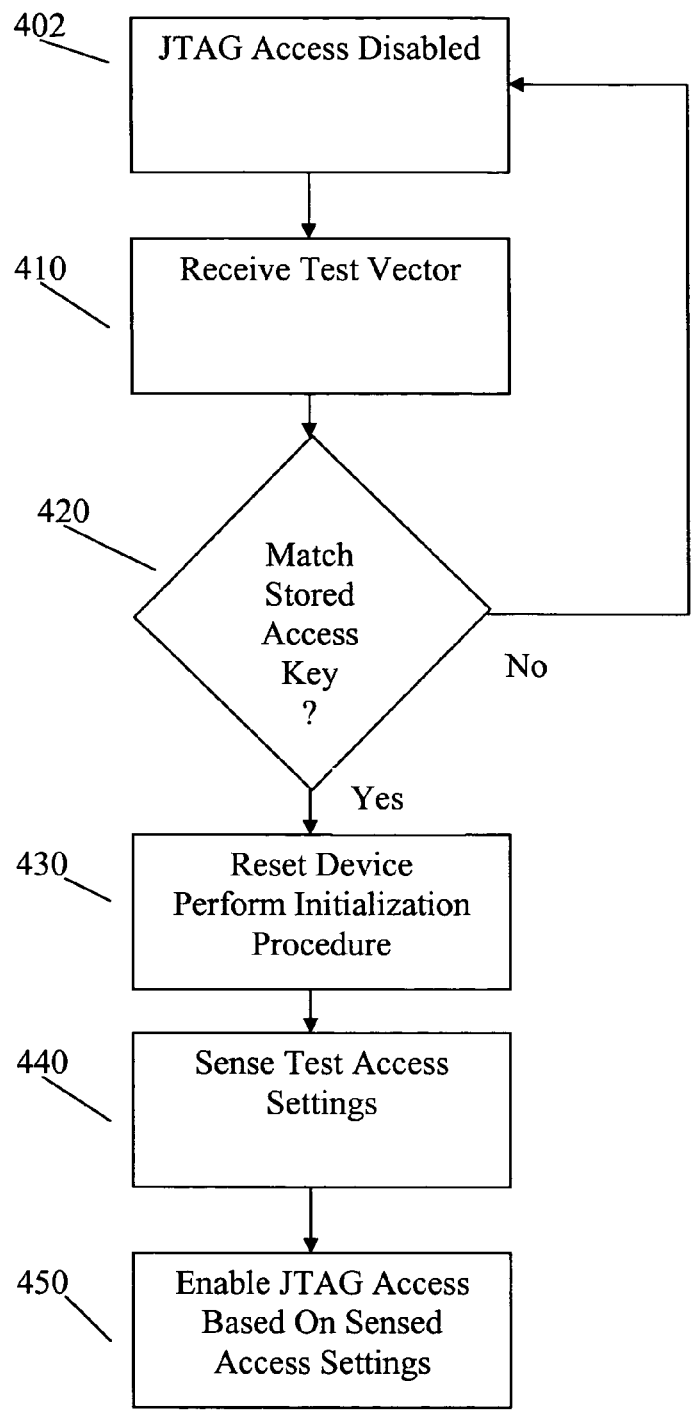
FIG. 4 is a flowchart of a secure test implementation using a non-secure access key.

FIG. 4 is a flowchart of a secure debug process 400 that can be performed, for example, by the device under test 10 of FIG. 1, the signal processing module 200 of FIG. 2, or the ASIC 300 of FIG. 3. For purposes of explanation, we will assume that the process 400 is being performed by the ASIC 300 of FIG. 3.

The process 400 begins at block 402 where the ASIC initially disables test access. JTAG test access is shown as being disabled, but the disabled access can be any type of test access or any type of communication access. As discussed above, the disabled test access state allows test vectors to be written to the unlock chain module.

It may be advantageous for this to be the default state of the ASIC upon power up. Even where the states of registers may be random upon power up, the length of the access key may be chosen of sufficient length to essentially reduce the probability of the random registers values coinciding with the access key value.

The ASIC may then receive a test vector in block 410. Upon receipt of the test vector, the ASIC proceeds to decision block 420. At decision block 420, the ASIC determines whether the received test vector matches a stored access key. The ASIC can be configured to only compare the test vector stored in a predetermined location within the unlock chain module to the access key. Thus, any received test vectors not directed to the unlock chain module will not result in enablement of test access even if the test vector coincides with the access key.

Thus, if the ASIC determines that the received test vector does not correspond to the stored access key, test access remains disabled and the ASIC returns to block 402. However, if the received test vector matches the stored access key, the ASIC proceeds to block 430.

In block 430, the ASIC performs a reset or initialization procedure. The initialization procedure may entail various steps. For the purposes of securing a communication port, such as a test port, the reset procedure includes initializing the state of the registers and processes within the ASIC that are associated with the test port. For example, the reset process may include clearing or otherwise initializing all registers associated with test port access and initializing clocks and timers. The reset process may occur asynchronously, synchronized to a clock, or in a combination of asynchronous and synchronous actions.

After the ASIC performs the reset procedure, the ASIC proceeds to block 440 to sense the test access settings. This may include sensing the states of one or more fuses, such as electrically programmable fuses. The ASIC may store the fuse states in one or more registers in one or more memory locations.

After the access settings are sensed, the ASIC proceeds to block 450 and enables JTAG access based at least in part, on the sensed access settings. For example, the fuse states may directly correspond to access, such that a blown fuse corresponds to disabled access of a particular module or portion of the ASIC. Alternatively, the fuse states may correspond indirectly to access states. Thus, a predetermined configuration of a plurality of fuses may correspond to a particular access state. In one embodiment, eight fuses may form a byte and provide access information for up to 256 access configurations. Once enabled, the access remains enabled until an event results in the ASIC returning to the disabled state in block 402. Such an event can be, for example, a power down of the ASIC. Other events may also result in disabling of the test access.

Thus, access to a communication port of an electronic device, such as a JTAG test interface in an ASIC, may be secured from physical attacks by initializing the port in a disabled or otherwise severely limited state. The configured accessibility of the port may be enabled when the device receives a non-secure access key vector. The ASIC compares the received non-secure access key vector against an internally stored access key and enables the communication port in the ASIC if a predetermined relationship exists between the two. As part of enabling the communication port, the ASIC may perform a initialization routine and may selectively enable access via the communication port in response to a predetermined access configuration. The access configuration may be determined base in part on states of one or more fuses within the ASIC.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled persons may implement the described functionality in varying ways for each particular application, but such implementation decisions should not be interpreted as causing a departure from the scope of the disclosure.

The various illustrative logical blocks, modules, and circuits described in connection with the embodiments disclosed herein may be implemented or performed with a general purpose processor, a digital signal processor (DSP), a Reduced Instruction Set Computer (RISC) processor, an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

The steps of a method, process, or algorithm described in connection with the embodiments disclosed herein may be embodied directly in hardware, in a software module executed by a processor, or in a combination of the two. A software module may reside in RAM memory, flash memory, non-volatile memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a mobile station. In the alternative, the processor and the storage medium may reside as discrete components in a mobile station.

The above description of the disclosed embodiments is provided to enable any person skilled in the art to make or use the disclosure. Various modifications to these embodiments will be readily apparent to those skilled in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. A method of securing an electronic device, the method comprising:
    initializing the electronic device into a determinable disabled state to limit access to one or more secure locations of a plurality of secure locations within the electronic device;
    receiving an access key vector; and
    selectively initializing a test access state of the electronic device,
    wherein the selectively initializing the test access state of the electronic device includes:
        comparing the received access key vector to a stored access key;
        determining that the access key vector and stored access key have a predetermined relationship;
        implementing an internal reset for initializing at least one fuse to a logical state corresponding to a fuse state, wherein the logical state corresponding to the fuse state of the at least one fuse is either random, floating, or indeterminable prior to implementation of the internal reset;
        sensing the logical state corresponding to the fuse state of the at least one fuse; and
        enabling communication access to a decryption module and encrypted data within the electronic device based in part on the logical state corresponding to the fuse state of the at least one fuse, and based further in part on the determination that the received access key vector and the stored access key have the predetermined relationship.

2. The method of claim 1, wherein the predetermined relationship comprises an equality.

3. The method of claim 1, wherein initializing the electronic device in the disabled state comprises initializing the electronic device in a disabled test access state.

4. The method of claim 3, wherein the test access state comprises a boundary scan test access state.

5. The method of claim 1, wherein receiving the access key vector comprises receiving a non-secure access key vector via a test interface.

6. A method of securing an electronic device, the method comprising:
    initializing the electronic device in a boundary scan test disabled state to limit access to one or more secure locations of a plurality of secure locations within the electronic device;
    receiving an access key vector via a boundary scan test interface;
    comparing the access key vector to a stored access key;
    performing an initialization process if the access key vector and the stored access key have a predetermined relationship, wherein the initialization process includes an internal reset for initializing at least one fuse to a logical state corresponding to a fuse state, wherein the logical state corresponding to the fuse state of the at least one fuse is either random, floating, or indeterminable prior to implementation of the internal reset;
    sensing the logical state corresponding to the fuse state following the initialization process; and
    setting the electronic device to a boundary scan enabled state based in part on the at least one fuse state and based further in part on the predetermined relationship between the access key vector and the stored access key, wherein the setting the boundary scan enabled state includes enabling communication access to encrypted data within the electronic device based in part on the fuse state of the at least one fuse.

7. The method of claim 6, wherein receiving the access key comprises receiving within a predetermined boundary scan module a multiple bit access key value.

8. A secure electronic device, the device comprising:
    means for receiving an access key vector via a boundary scan test interface;
    means for comparing the access key vector to a stored access key;
    means for performing an initialization process if the access key vector and the stored access key have a predetermined relationship, wherein the initialization process includes an internal reset for initializing at least one fuse to a logical state corresponding to a fuse state, wherein the logical state corresponding to the fuse state of the at least one fuse is either random, floating, or indeterminable prior to implementation of the internal reset;
    means for sensing the logical state corresponding to the fuse state following the initialization process; and
    means for setting the electronic device to a boundary scan enabled state based in part on the at least one fuse state and based further in part on the predetermined relationship between the access key vector and the stored access key, wherein the means for setting the boundary scan enabled state includes means for enabling communication access to encrypted data within the electronic device based in part on the fuse state of the at least one fuse.

9. A secure electronic device, the device comprising:
    a boundary scan interface configured to selectively provide a boundary scan access to the device based in part on a test access state;
    an unlock chain module configured to receive an access key vector via the boundary scan interface;

at least one fuse configured to limit access to one or more secure locations of a plurality of secure locations within the electronic device;

a reset module for implementing an internal reset, in response to the receiving of the access key vector, for initializing at least one fuse to a logical state corresponding to a fuse state, wherein the logical state corresponding to the fuse state of the at least one fuse is either random, floating, or indeterminable prior to implementation of the internal reset;

an access key module configured to store an access key value; and a comparator configured to compare the access key vector to the access key value and selectively initialize the test access state based in part on a relationship of the access key vector to the access key value, wherein selectively initializing the test access state includes:

sensing the logical state corresponding to the fuse state of the at least one fuse; and enabling communication access to a decryption module and encrypted data within the electronic device based in part on the logical state corresponding to the fuse state of the at least one fuse.

10. The device of claim 9, further comprising:

a hardware key module configured to store a secure hardware key value, and configured to be accessible to the boundary scan interface based in part on the test access state.

11. The device of claim 9, wherein the access key vector comprises a non-secure access key vector.

12. The device of claim 9, wherein the access key vector comprises a 64-bit vector.

13. The device of claim 9, further comprising at least one override register configured to provide an override test access state that overrides the test access state.

14. The device of claim 13, wherein the at least one override register comprises at least one software configurable register.

15. The device of claim 9, wherein the boundary scan interface comprises a JTAG test interface.

16. The device of claim 9, wherein the device comprises an application specific integrated circuit (ASIC).

17. The method of claim 1, wherein the test access state provides different intermediate degrees of access to the electronic device between full access and no access.

18. The method of claim 1, further comprising:

transforming the access key vector prior to comparing it to the stored access key.

19. The method of claim 18, wherein different portions of the transformed access key vector determine different levels of the test access state.

20. The method of claim 1, wherein the selectively initializing the test access state of the electronic device further includes inhibiting access to the secure locations within the electronic device if, upon powering up of the electronic device, a reset connection is physically disabled or power to the electronic device is continually cycled.

21. The method of claim 6, further comprising:

inhibiting access to the secure locations within the electronic device if, upon powering up of the electronic device, a reset connection is physically disabled or power to the electronic device is continually cycled.

22. The electronic device of claim 9, wherein the boundary scan interface is adapted to inhibit access to the encrypted data if, upon powering up of the electronic device, a reset connection is physically disabled or power to the electronic device is being continually cycled.

23. A non-transitory processor readable medium having one or more instructions for securing an electronic device, the instructions which when executed by at least one processor causes the processor to:

initialize the electronic device into a determinable disabled state to limit access to one or more secure locations of a plurality of secure locations within the electronic device;

receive an access key vector; and selectively initialize a test access state of the electronic device, wherein the selectively initialize the test access state of the electronic device includes:

compare the received access key vector to a stored access key;

determine that the access key vector and stored access key have a predetermined relationship;

implement an internal reset for initializing at least one fuse to a logical state corresponding to a fuse state, wherein the logical state corresponding to the fuse state of the at least one fuse is either random, floating, or indeterminable prior to implementation of the internal reset;

sense the logical state corresponding to the fuse state of the at least one fuse; and enable communication access to a decryption module and encrypted data within the electronic device based in part on the logical state corresponding to the fuse state of the at least one fuse, and based further in part on the determination that the received access key vector and the stored access key have the predetermined relationship.

24. The non-transitory processor readable medium of claim 23, wherein selectively initializing the test access state of the electronic device further includes inhibiting access to the secure locations within the electronic device if, upon powering up of the electronic device, a reset connection is physically disabled or power to the electronic device is being continually cycled.

* * * * *